US007812445B2

(12) United States Patent
Baek et al.

(10) Patent No.: US 7,812,445 B2
(45) Date of Patent: Oct. 12, 2010

(54) SEMICONDUCTOR MEMORY MODULE HAVING AN OBLIQUE MEMORY CHIP

(75) Inventors: Joong-Hyun Baek, Gyeonggi-do (KR); Sun-Won Kang, Seoul (KR); Moon-Jung Kim, Gyeonggi-do (KR); Hyung-Gil Baek, Gyeonggi-do (KR); Hee-Jin Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 749 days.

(21) Appl. No.: 11/740,821

(22) Filed: Apr. 26, 2007

(65) Prior Publication Data

US 2007/0252271 A1 Nov. 1, 2007

(30) Foreign Application Priority Data

Apr. 26, 2006 (KR) .............. 10-2006-0037672

(51) Int. Cl.
*H01L 23/34* (2006.01)
(52) U.S. Cl. .............. 257/723; 257/E25.012; 257/686; 257/776; 438/125
(58) Field of Classification Search .......... 257/E21.499, 257/E25.012, E25.029, 200, 686, 692, 723, 257/775, 776, 777; 361/748, 760; 174/260; 438/125
See application file for complete search history.

(56) References Cited

U.S. PATENT DOCUMENTS

| 4,794,431 | A | * | 12/1988 | Park | 257/82 |
| 5,126,823 | A | * | 6/1992 | Otsuka et al. | 257/666 |
| 5,410,182 | A | * | 4/1995 | Kurafuchi et al. | 257/692 |
| 5,640,044 | A | * | 6/1997 | Takehashi et al. | 257/666 |
| 5,953,216 | A | * | 9/1999 | Farnworth et al. | 361/777 |
| 6,169,325 | B1 | * | 1/2001 | Azuma et al. | 257/685 |
| 6,324,436 | B1 | * | 11/2001 | Moresco | 700/36 |
| 6,642,554 | B2 | | 11/2003 | Yeh et al. | 257/200 |
| 6,751,113 | B2 | * | 6/2004 | Bhakta et al. | 365/63 |
| 6,850,414 | B2 | * | 2/2005 | Benisek et al. | 361/748 |
| 6,940,162 | B2 | * | 9/2005 | Eguchi et al. | 257/723 |
| 7,292,519 | B2 | * | 11/2007 | Tatsuno et al. | 369/120 |
| 7,348,219 | B2 | * | 3/2008 | Kim et al. | 438/125 |

FOREIGN PATENT DOCUMENTS

JP 2000-252418 9/2000

OTHER PUBLICATIONS

English language abstract of Japanese Publication No. 2000-252418.

* cited by examiner

*Primary Examiner*—Chris Chu
(74) *Attorney, Agent, or Firm*—Harness, Dickey & Pierce

(57) ABSTRACT

Provided is a semiconductor memory module allowing a filling member formed between a module substrate and memory chips mounted on the module substrate to completely fill the space between the module substrate and the memory chips. According to embodiments of the present invention, the semiconductor memory module includes a module substrate having at least one memory chip mounted on the substrate such that its edges are oblique to major and minor axes bisecting the module substrate. The oblique orientation allows for an improved opening between memory chips formed on the substrate so that the filling member may be properly formed between the module substrate and the memory chips to prevent voids where the filling member is not formed.

23 Claims, 4 Drawing Sheets

SEMICONDUCTOR MEMORY MODULE HAVING AN OBLIQUE MEMORY CHIP

CROSS-REFERENCE TO RELATED APPLICATION

This application claims priority under 35 U.S.C. §119 to Korean Patent Application No. 2006-37672 filed on Apr. 26, 2006 the contents of which are incorporated herein by reference in their entirety.

BACKGROUND

1. Field of the Invention

Embodiments of the present invention relate to a semiconductor memory module. More particularly, embodiments of the present invention relate to a semiconductor memory module including a module substrate having an asymmetrically aligned semiconductor memory chip mounted on the module substrate.

2. Description of the Related Art

A semiconductor memory module is generally manufactured by processes including a process for forming a semiconductor memory chip including integrated circuits on a semiconductor substrate, an electrical die sorting (EDS) process for inspecting and sorting the semiconductor memory chip, a package process for protecting the semiconductor memory chip, and a mounting process for installing the packaged semiconductor memory chip on a module substrate.

Semiconductor memory modules are developed to have a high degree of integration and a high degree of performance. Thus, the package process becomes more important to ensure these high degrees of integration and performance of the semiconductor memory modules because the package process may have substantial effect on various characteristics of the semiconductor memory module affecting the integration and performance, such as size, price, heat dissipation capacity, electrical conductance, reliability, etc.

Conventional semiconductor memory modules are generally manufactured by one of the following processes: a single inline package (SIP) process, a dual inline package (DIP) process, a quad flat package (QFT) process, or a ball grid array (BGA) process. However, other processes have been developed to ensure high degrees of integration for the semiconductor memory module, such as a chip scale package (CSP) process, a multi chip package (MCP) process, a stacked chip scale package (SCSP) process, or a wafer level chip scale package (WLCSP) process. Additionally, a wafer level package (WLP) process has been developed to improve the integration degree of the semiconductor memory module. In the WLP process, a series of processes, such as a die bonding process, a molding process, a trimming process, and a marking process are performed on semiconductor memory chips after forming the semiconductor memory chips on a wafer. Typically, the wafer is then cut to further the manufacturing process of the semiconductor memory module.

Semiconductor memory modules are usually divided into single inline memory modules and dual inline memory modules in accordance with an array of semiconductor memory chips thereof. Recently, the dual inline memory module ensuring high degrees of integration and capacity has become more widely used in various apparatuses because the semiconductor memory chips are mounted on both sides of the dual inline memory module. Additionally, the dimensions of semiconductor memory modules have been internationally standardized. For example, the dimensions of a semiconductor memory module employed in a general computer are different from those of a semiconductor memory module used in a notebook computer.

FIG. 1 is a plan view illustrating a conventional semiconductor memory module employed in a notebook computer, and FIG. 2 is a cross-sectional view illustrating the conventional semiconductor memory module shown in FIG. 1 taken along a line of I-I'.

Referring to FIGS. 1 and 2, a conventional semiconductor memory module 20 includes a module substrate 10, semiconductor memory chips 12, passive devices 14, and a filling member 18.

The module substrate 10 includes stacked integrated circuit substrates and a connector pin 11 disposed on one end portion of the module substrate 10. Each of the integrated circuit substrates has a size of about 67.6 mm×about 30.0 mm. Additionally, each of the semiconductor memory chips 12 has a size of about 14.0 mm×about 9.5 mm. Generally, eight semiconductor memory chips 12 arranged along two rows are mounted on the module substrate 10. The semiconductor memory chips 12 are mounted on the module substrate 10 using solder balls 13.

The passive devices 14 are typically arranged between the two rows of semiconductor memory chips 12. The filling member 18 is disposed between the module substrate 10 and the semiconductor memory chips 12 to enclose the solder balls 13. The filling member 18 generally includes a thermosetting resin. When a process is performed to evaluate the reliability of the semiconductor memory chips 12 mounted on the module substrate 10, the filling member 18 may prevent a connection failure between the module substrate 10 and the semiconductor memory chips 12 caused by the thermal expansion coefficient difference between the module substrate 10 and the semiconductor memory chips 12.

In these conventional semiconductor memory modules 20 used in a notebook computer, the semiconductor memory chips 12 occupy a large area of the module substrate 10 as shown in FIG. 1 such that the intervals between the semiconductor memory chips 12 become exceedingly small. However, as the intervals between the semiconductor memory chips 12 become small, the filling member 18 may not completely fill up the space between the module substrate 10 and the semiconductor memory chips 12. That is, the space between the module substrate 10 and the semiconductor memory chips 12 becomes so small that the filling member 1 8 may not easily fill up the space even though the filling member 18 may be applied when it is in a liquid phase. As a result, a void 15 may be generated in the space between the module substrate 10 and the semiconductor memory chips 12 as shown in FIG. 2 because the filling member 18 may not completely fill up the space between the module substrate 10 and the semiconductor memory chips 12. When the void 15 occurs in the space typically replete with the filling member 18, cracks in the solder balls 13 may be caused in a subsequent thermal process for combining the module substrate 10 and the semiconductor memory chips 12. This in turn, may cause an electrically failure as the module substrate 10 may not be electrically connected to the semiconductor memory chips 12. Thus, the semiconductor memory module may be faulty leading to reduced performance of both the semiconductor memory module and the notebook computer including the semiconductor memory module 20.

SUMMARY

Example embodiments of the present invention provide a semiconductor memory module having an improved construction to allow the space between a module substrate and semiconductor memory chips to be completely filled with a filling member.

According to one embodiment of the present invention, a semiconductor memory module includes a module substrate and memory chips.

The module substrate may have a substantially rectangular shape and include a major axis and a minor axis substantially perpendicular the major axis. The memory chips are mounted on the module substrate, wherein each of memory chips is tilted with respect to the major axis or the minor axis.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Figure 1:
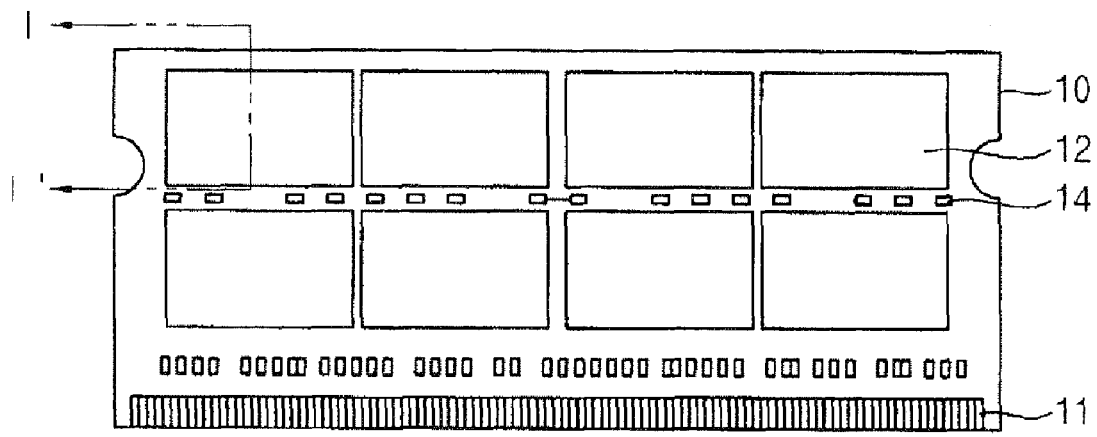
FIG. 1 is a plan view illustrating a conventional semiconductor memory module employed in a notebook computer.
Figure 2:
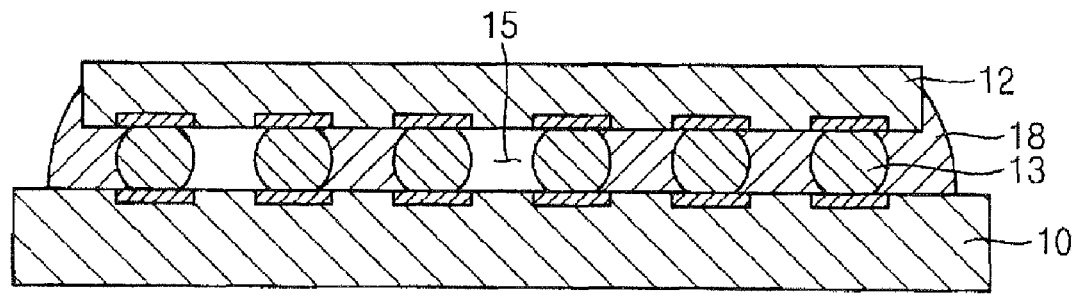
FIG. 2 is a cross-sectional view illustrating the conventional semiconductor memory module shown in FIG. 1 taken along a line of I-I'.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes and thicknesses of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
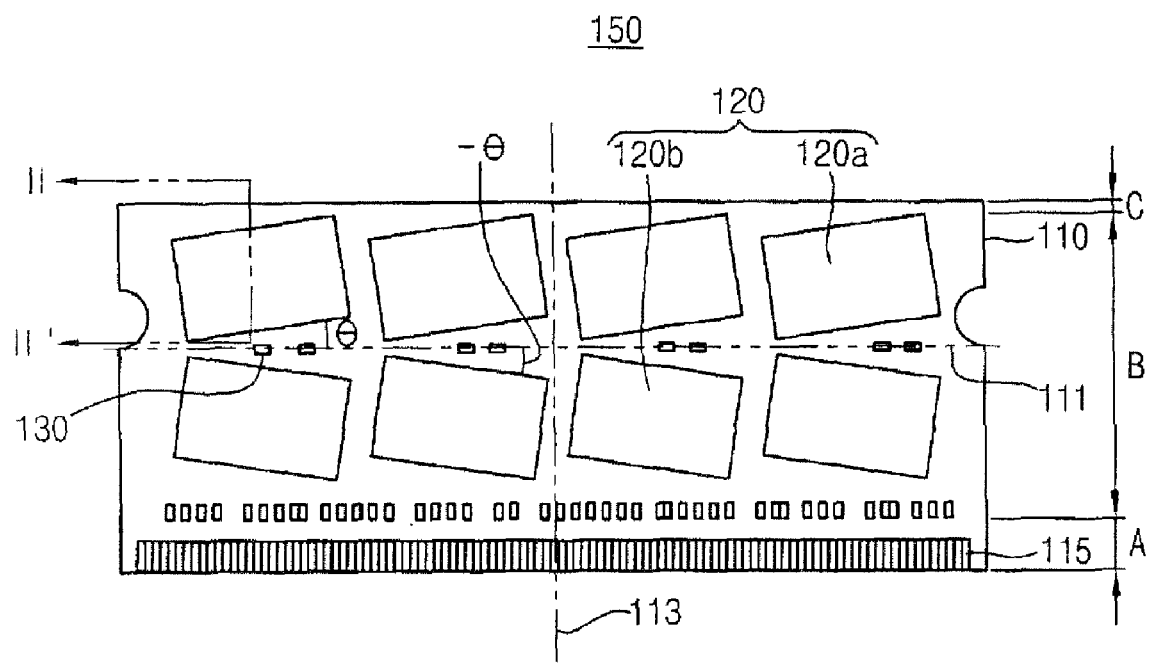
FIG. 3 is a plan view illustrating a semiconductor memory module in accordance with an embodiment of the present invention.
Figure 4:
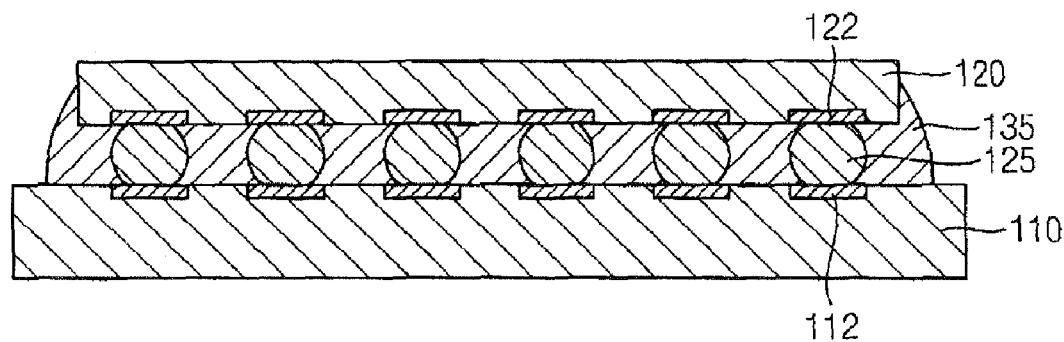
FIG. 4 is a cross-sectional view illustrating the semiconductor memory module shown in FIG. 3 taken along a line of II-II'.

FIG. 3 is a plan view illustrating a semiconductor memory module in accordance with an embodiment of the present invention, and FIG. 4 is a cross-sectional view illustrating the semiconductor memory module shown in FIG. 3 taken along a line of II-II'.

Referring to FIGS. 3 and 4, a semiconductor memory module 150 includes a module substrate 110, semiconductor memory chips 120 mounted on the module substrate 110, passive devices 130, and a filling member 135.

The semiconductor memory chips 120 may be oriented such that edges of the semiconductor memory chips 120 are oblique to the edges of the module substrate 110. That is, the side edges of the semiconductor memory chips 120 are not substantially parallel to either the of the side edges of the module substrate 110. Another way to describe this orientation of the semiconductor memory chips is to define a major axis 111 and a minor axis 113 that are substantially perpendicular to each other, where each of the major axis 111 and minor axis 113 substantially bisect the module substrate 110. Here, the semiconductor memory chips 120 are tiled with respect to the major axis 111 or the minor axis 113 giving them an oblique orientation with respect to the axes 111 and 113 and the module substrate 110. In the embodiment shown in FIG. 3, the semiconductor memory chips 120 are disposed on the module substrate 110 along a predetermined angle. The module substrate 110 may have a substantially rectangular shape that includes a major axis 111 and a minor axis 113, respectively defined to be substantially perpendicular to complementary adjacent sides of the module substrate. That is, the module substrate 110 may have a relatively long or major axis 111 corresponding to the dashed line that is substantially perpendicular to the shorter edges of the module substrate 110, and a relatively short or minor axis 113 corresponding to the dashed line that is substantially perpendicular to the longer edges of the module substrate 110. When the module substrate 110 has the substantially rectangular shape, some of the memory chips 120 may be tilted along a first direction relative to the major axis or the minor axis of the module substrate 110, whereas others of the memory chips 120 may be tilted in a second direction with respect to the minor axis or the minor axis of the module substrate 110. The first direction may be substantially opposed to the second direction. In the embodiment shown in FIG. 3, each of the semiconductor memory chips 120 are tilted away from the major axis 111 by an angle θ. However, various other arrangements of the semiconductor memory chips 120 are possible.

The module substrate 110 may be a part of the memory module 150 employed in various electronic apparatuses such as notebook computers or other electronic apparatuses. The module substrate 110 may include a printed circuit board (PCB) formed using a resin, such as a phenol resin, an epoxy resin, etc. A plurality of circuit wirings (not illustrated) for electrically connecting the memory chips 120 with one another may be formed on the module substrate 110 so as to connect various chips or devices on the module substrate 110. Examples of the PCB for the module substrate 110 may include a single-sided PCB, a double-sided PCB, or a multi-layered PCB in accordance with positions where the circuit wirings are formed. Connector pins 115 are disposed on one end portion of the module substrate 110. The connector pins 115 may electrically connect the memory module 150 to a socket of the notebook computer or other electronic apparatuses. That is, the connector pins 115 may make contact with the socket of the notebook computer or the electronic apparatuses such that the memory module 150 may be electrically connected to the notebook computer or the electronic apparatuses.

In some example embodiments of the present invention, the module substrate 110 includes a first area A, a second area B, and a third area C. The connector pins 115 are positioned in the first area A so that the socket of the notebook computer or the electronic apparatuses makes contact with the connector pins 115 in the first area of the module substrate 110. The memory chips 120 are positioned in the second area B of the module substrate 110. The third area C of the module substrate 110 may act as a buffer area and may help prevent the memory chips 120 from being damaged by an impact applied to the memory module 150 while inserting the memory module 150 into the socket of the notebook computer or the electronic apparatuses. Additionally, the third area C of the module substrate 110 may prevent the memory chips 120 from being damaged by the impact applied to the memory module 150 while separating the memory module 150 from the socket of the notebook computers or the electronic apparatuses. The third area C of the module substrate 110 may have a width considerably smaller than that of the second area B of the module substrate 110. Additionally, the width of the third area C of the module substrate 110 may be substantially smaller than that of the first area A of the module substrate 110.

As described above, the circuit wirings for the electrical connections among the memory chips 120 are formed on the module substrate 110. For example, the circuit wirings may be positioned in the second area B of the module substrate 110. The second area B of the module substrate 110 may include a first mounting region and a second mounting region (not illustrated). In some example embodiments, first semiconductor memory chips 120a may be tilted along a first direction relative to the major axis 111 or the minor axis 113, and may be mounted in the first mounting region. However, the second semiconductor memory chips 120b may be tilted in a second direction relative to the major axis 111 or the minor axis 113, and may be mounted in the second mounting region. For example, the eight memory chips 120 illustrated in FIG. 3 may be mounted on the module substrate 110 so that the upper four memory chips 120a are tilted from the major axis 111 in a first direction by an angle θ, while the lower four memory chips 120b are tiled from the major axis 113 in a second direction by an angle of −θ.

Each of the memory chips 120 may be electrically connected to the circuit wirings provided on the module substrate 110. In an example embodiment, each of the memory chips 120 may be mounted on the module substrate 110 using a conductive member 125, such as a solder ball, bump pad, or the like. The module substrate 110 may additionally include electrode pads 112 electrically connected to bonding pads 122 of the memory chips 120. Hence, the conductive members 125 are positioned between the electrode pads 122 and the bonding pads 122 such that the memory chips 120 may be electrically connected to the circuit wirings of the module substrate 110.

A filling member 135 is formed on the module substrate 110 to fill a space between the module substrate 110 and the memory chips 120. The filling member 135 may enclose the conductive members 125 and lower portions of the memory chips 120. Thus, the memory chips 120 may be firmly fixed to the module substrate 110 by the filling member 110, which may also help improve the electrical connections between the memory chips 120 and the module substrate 110. In an example embodiment, the filling member 135 may be formed by injecting a filling agent having a liquid phase into the space between the module substrate 110 and the memory chips 120. Such a process may be referred to as an under filling process.

In some example embodiments of the present invention, the memory chips 120 may be disposed on the module substrate 110 in a matrix structure. Here, each of the memory chips 120 may be slant with respect to a row direction or a column direction of the matrix structure. For example, the memory chips 120 may be mounted on the module substrate 110 in a matrix structure having two columns and four rows.

The first memory chips 120a disposed in the first mounting region of the module substrate 110 may be tilted along the first direction, whereas the second memory chips 120b mounted in the second mounting region of the module substrate 110 may be tilted along the second direction. In other words, an arrangement of the first memory chips 120a may correspond to a first row of the matrix structure, whereas an arrangement of the second memory chips 120b may correspond to a second row of the matrix structure. The first direction may be substantially opposed to the second direction.

The first and the second memory chips 120a and 120b may be symmetrically disposed with one another with respect to the major axis or the minor axis of the module substrate 110. That is, each of the first memory chips 120a may be symmetrically mounted relative to each of the second memory chips 120b along the row direction or the column direction of the matrix structure. Thus, the first memory chips 120a in the first mounting region may be symmetrized to the second memory chips 120b in the second mounting region, respectively. The first and the second memory chips 120a and 120b may have substantially identical structures. The first memory chips 120a may be repeatedly disposed in the first mounting region along the major axis of the module substrate 110. Additionally, the second memory chips 120b may be repeatedly mounted in the second mounting region along the major axis of the module substrate 110.

In some example embodiments of the present invention, the memory chips 120 may be tilted by an angle of about 3° to about 40° or about −3° to about −40° with respect to the major axis or the minor axis of the module substrate 110. For example, the first memory chips 120a may be tilted by an angle of about 3° to about 40° relative to the major axis or the minor axis of the module substrate 110, whereas the second memory chips 120b may be tilted by an angle of about −3° to about −40° with respect to the major axis or the minor axis of the module substrate 110. In other words, an angle between the first direction and the major axis or the minor axis may be in a range of about 3° to about 40°, and also an angle between the second direction and the major axis or the minor axis may be in a range of about −3° to about −40°.

When tilted angles θ of the memory chips 120 are above about 40° or below about −40°, the memory chips 120 may not be properly mounted on the module substrate 110 because the second area B of the module substrate 110 is relatively insufficient. When the tilted angles θ of the memory chips 120 are below about 3° or above about −3°, the filling member 135 may not sufficiently fill the space between the memory chips 120 and the module substrate 110 because intervals among the memory chips 120 may not be sufficiently ensured. Therefore, the tilted angles θ of the memory chips 120 relative to the major axis or the minor axis of the module substrate 110 may preferably be in a range of about 3° to about 40° or about −3° to about −40°. For example, the tilted angles θ of the memory chips 120 relative to the major axis or the minor axis of the module substrate 110 may be in a range of about 5° to about 30° or about −5° to about −30°. In an example embodiment, the tilted angles θ of the memory chips 120 relative to the major axis or the minor axis of the module substrate 110 may be in a range of about 5° to about 25° or about −5° to about −25°. However, other embodiments of the invention are contemplated where the tilt angles may be greater or less than the tilt angles described above. That is, the tilt angles may be greater than 40° or less than 3°.

As described above, the memory chips 120 mounted on the module substrate 110 may be arranged in the matrix structure having two rows and four columns. When the module substrate 110 has an area of about 14.0 mm×about 9.5 mm, about eight memory chips 120 may be mounted on the module substrate 110. Here, the first row of the matrix structure may include four first memory chips 120a tilted along the first direction, and the second row of the matrix structure may include four second memory chips 120b tilted along the second direction.

In some example embodiments of the present invention, the memory chips 120 may be mounted on a front face and a rear face of the module substrate 110, and may be arranged in matrix structures having two rows and four columns, respectively. When the module substrate 110 has an area of about 14.0 mm×about 9.5 mm, about sixteen memory chips 120 may be mounted on the module substrate 110. That is, eight memory chips 120 may be mounted on the front face of the module substrate 110 as the matrix structure has two rows and four columns, and also eight memory chips 120 may be disposed on the rear face of the module substrate 110 as the matrix structure having two rows and four columns. When the semiconductor memory module 150 includes sixteen memory chips 120, the semiconductor memory module 150 may correspond to a small out dual inline memory module.

The passive devices 130 may be disposed on the module substrate 110 along the major axis or the minor axis. The passive devices 130 may be positioned between the first memory chips 120a and the second memory chips 120b. That is, the passive devices 130 may be located in spaces between the tilted first memory chips 120a and the tilted second memory chips 120b. For example, two passive devices 130 may be disposed between one of the first memory chips 120a and one of the second memory chips 120b. Each of the passive devices 130 may prevent noise from being generated by the memory chips 120. Alternatively, the passive devices 130 may be disposed on a peripheral portion of the module substrate 110.

The filling member 135 is formed between the module substrate 110 and the memory chips 120. When the conductive members 125 are provided for the electrical connections of the memory chips 120 relative to the module substrate 110, the space between the module substrate 110 and the memory chips 120 is generated due to the heights of the conductive members 125, such as the solder balls. The filling member 135 may completely fill up the space between the module substrate 110 and the memory chips 120 caused by the conductive members 125. In an example embodiment, the filling member 135 may be formed by injecting a liquid-phased filling agent into the space between the module substrate 110 and the memory chips 120. The filling agent may include a thermosetting resin having a liquid phase. The filling agent may be provided into the space between the module substrate 110 and the memory chips 120 using a filling agent supply member (not illustrated). The filling agent may be advantageously injected into the space between the module substrate 110 and the memory chips 120 while moving the filling agent supply member along peripheral portions of the memory chips 120. Considering a formation of the filling member 135, predetermined intervals may be ensured among the memory chips 120 so that the filling agent may completely fill up the space between the module substrate 110 and the memory chips 120 by injecting the filling agent into the space through the intervals among the memory chips 120. Namely, the filling agent may be easily injected into the space along the peripheral portions of the memory chips 120 because the predetermined intervals may be advantageously enlarged among the memory chips 120 to allow for the filling agent to flow more easily into the space between the module substrate 110 and the memory chips 120.

Figure 5:
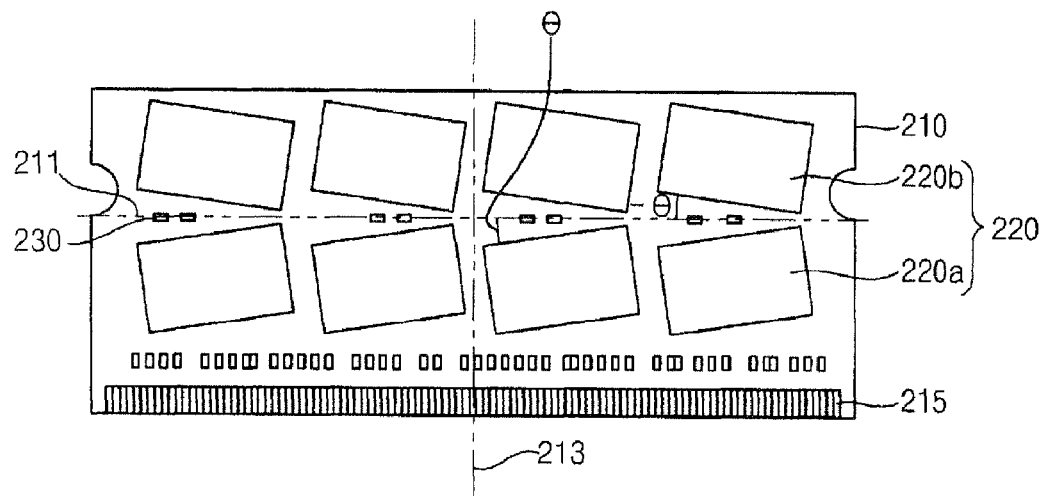
FIG. 5 is a plan view illustrating a semiconductor memory module in accordance with another embodiment of the present invention.

FIG. 5 is a plan view illustrating a semiconductor memory module in accordance with another embodiment of the present invention.

Referring to FIG. 5, a semiconductor memory module 250 includes a module substrate 210, semiconductor memory chips 220 beveled and mounted on the module substrate 210, passive devices 230, and a filling member (not illustrated).

The module substrate 210 may have a substantially rectangular shape that includes a major axis 211 and a minor axis 213. The major axis 211 may have a length substantially longer than the minor axis 213. Some memory chips 220 may be tilted along a first direction with respect to the major axis 211, whereas other memory chips 220 may be slanted in a second direction relative to the major axis 211. The first direction may be opposed to the second direction.

The tilted memory chips 220 are disposed in mounting regions (not illustrated) of the module substrate 210. Circuit wirings (not illustrated) may be provided on the module substrate 210 for electrical connection of the memory chips 220. In an example embodiment, the module substrate 210 has a first mounting region where the memory chips 220 tilted in the first direction are disposed. The module substrate 210 additionally has a second mounting region on which the memory chips 220 tilted along the second direction are mounted.

Each of the memory chips 220 that may be electrically connected to the circuit wiring is provided on the module substrate 210. The memory chips 220 may be electrically connected to the module substrate 210 using conductive members (illustrated in FIG. 4), such as solder balls.

In some example embodiments of the present invention, the memory chips 220 may be disposed on the module substrate 210 in a matrix structure. For example, the matrix structure may have two rows and four columns. The memory chips 220 may be tilted with respect to the row or the column of the matrix structure.

In some example embodiments of the present invention, the memory chips 220 are divided into first memory chips 220a and second memory chips 220b. The second memory chips 220b may be disposed in the second mounting region of the module substrate 210 and the first memory chips 220a may be positioned in the first mounting region of the module substrate 210. Additionally, the first memory chips 220a may be tilted along the first direction, whereas the second memory chips 220b may slant in the second direction. The second memory chips 220b may be included in a first row of the matrix structure, and the first memory chips 220b may be included in a second row of the matrix structure.

The memory chips 220 may be horizontally symmetrized to one another relative to the major axis of the module substrate 210. For example, each of the first memory chips 220a may be horizontally symmetrized with respect to each of the second memory chips 220b. That is, each of the tilted first memory chips 220a may correspond to each of the tilted second memory chips 220b.

The tilted second memory chips 220b may be disposed in the second mounting region of the module substrate 210, and also the tilted first memory chips 220a may be positioned in the first mounting region of the module substrate 210. Since each of the first memory chips 220a may be symmetrized relative to each of the second memory chips 220b, all of the first memory chips 220a may be symmetrized with respect to all of the second memory chips 220b.

In some example embodiments of the present invention, the memory chips 220 may be tilted relative to the major axis of the module substrate 210 by predetermined angles of about 3° to about 40°. For example, the first memory chips 220a may be slanted relative to the major axis by angles of about 3° to about 40°, and the second memory chips 220b may be tilted with respect to the major axis by angles of about −3° to about −40°.

When tilted angles θ of the memory chips 220 are above about 40°, the memory chips 220 may not be properly mounted on the module substrate 210 because the mounting area for the chips on the module substrate 210 may be insufficient. When the tilted angles θ of the memory chips 220 are below about 3° or above about −3°, a filling member may not sufficiently fill a space between the module substrate 210 and memory chips 220 because intervals among the memory chips 220 may not be sufficiently enlarged. Therefore, the tilted angles θ of the memory chips 220 relative to the major axis of the module substrate 210 may be in a range of about 3° to about 40° or about −3° to about −40°. For example, the tilted angles θ of the memory chips 220 relative to the major axis of the module substrate 210 may be in a range of about 5° to about 30° or about −5° to about −30°. In an example embodiment, the tilted angles θ of the memory chips 220 relative to the major axis of the module substrate 210 may be in a range of about 5° to about 25° or about −5° to about −25°. However, as mentioned above, these tilted angles θ may be greater or smaller in other embodiments.

In an example embodiment of the present invention, the semiconductor memory module 250 may include a small outline single inline memory module. Alternatively, the semiconductor memory module 250 may include a small outline dual inline memory module.

The passive devices 230 may be disposed on the module substrate 210 along the major axis 211. The passive devices 230 may be located between adjacent tilted memory chips 220. Namely, each of the passive devices 230 may be disposed in a space between one of the tilted first memory chips 220a and one of the tilted second memory chips 220b. In an example embodiment, two passive devices 230 may be positioned between the symmetrized first and second memory chips 220a and 220b. The passive devices 230 may prevent noise from being generated from the memory chips 220.

The filling member may be disposed between the module substrate 210 and the memory chips 220. The space between the module substrate 210 and the memory chips 220 may be generated because of the height of the conductive members. The filling member may fully fill up the space between the module substrate 210 and the memory chips 220. In an example embodiment, the filling member 135 may include a filling agent such as a thermosetting resin having a liquid phase. The filling member may be formed in the space by injecting the filling agent into the space between the module substrate 210 and the memory chips 220. The filling agent may be provided into the space using a filling agent supply member while moving the filling agent supply member along peripheral portions of the memory chips 220. To completely fill up the space with the filling member, desired intervals may be ensured among the memory chips 220 by injecting the filling agent into the space through the desired intervals among the memory chips 220.

Figure 6:
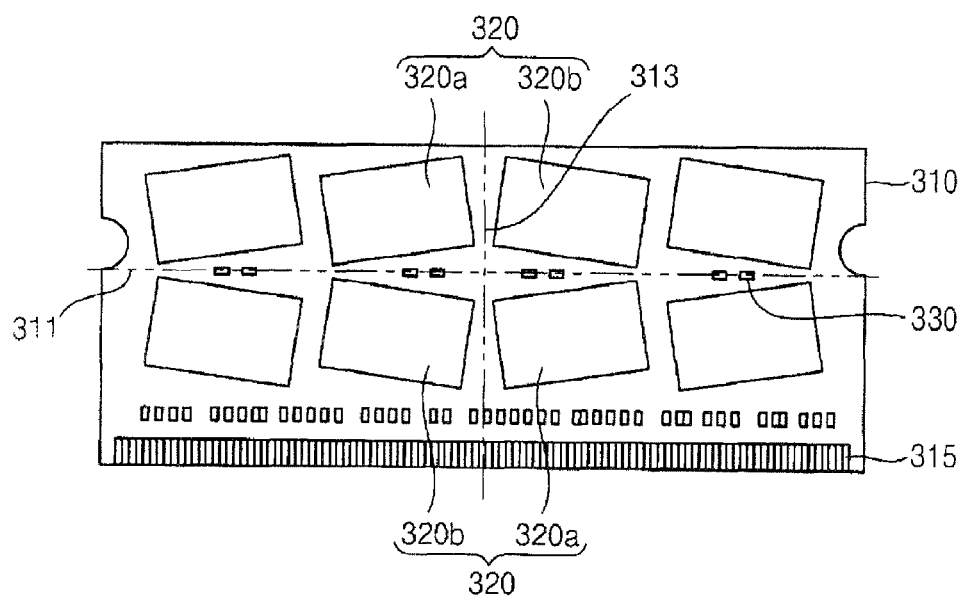
FIG. 6 is a plan view illustrating a semiconductor memory module in accordance with yet another embodiment of the present invention.

FIG. 6 is a plan view illustrating a semiconductor memory module in accordance with yet another embodiment of the present invention.

Referring to FIG. 6, a semiconductor memory module 350 includes a module substrate 310, memory chips 320 mounted on the module substrate 310, passive devices 330, and a filling member (not illustrated).

The module substrate 310 may have a substantially rectangular shape including a major axis 311 and a minor axis 313. A length of the minor axis 313 may be substantially shorter than that of the major axis 311. The memory chips 320 may be tilted by predetermined angles with respect to one another or with respect to one of the major or minor axes 311, 313. Some memory chips 320 may be slanted along a first direction relative to a major axis 311 of the module substrate 310, whereas other memory chips 320 may be tilted in a second direction relative to the major axis 311 of the module substrate 310.

In some example embodiments of the present invention, the module substrate 310 may be divided into a first mounting region and a second mounting region (now illustrated). Additionally, the memory chips 320 may be divided into first memory chips 320a and second memory chips 320b. The first and the second memory chips 320a and 320b may be tilted along the first and the second directions, respectively. Wiring or circuits (not illustrated) for electrically connecting the semiconductor chips 320 may be formed on the module substrate 310.

The first and the second memory chips 320a and 320b may be electrically connected to the circuit wiring using conductive members (such as 125 illustrated in FIG. 4). That is, the memory chips 320 may be electrically connected to the module substrate 310 using conductive members, such as solder balls.

In some example embodiments of the present invention, the memory chips 320 may be disposed on the module substrate 310 in a matrix structure. The first and the second memory chips 320a and 320b may be tilted relative to the major axis 311 or the minor axis 313 of the module substrate 310. In other words, the first and the second memory chips 320a and 320b may slant with respect to the rows or columns of the matrix structure. For example, the matrix structure may include two rows and four columns.

In some example embodiments of the present invention, the first and the second memory chips 320a and 320b in an upper area of the module substrate 310 may be symmetrized with each other centering on a vertical axis (here the minor axis 313). Additionally, the second and the first memory chips 320b and 320a in a lower area of the module substrate 310 may be symmetrized with the second and first memory chips 320b and 320a in an upper area of the module substrate 310 centering on a horizontal axis (here the major axis 311). For example, two of the first memory chips 320a and two of the second memory chips 320b may be sequentially disposed in the upper area of the module substrate 310. Further, another two of the second memory chips 320b and another two of the first memory chips 320a may be sequentially disposed in the lower area of the module substrate 310.

In some example embodiments of the present invention, the memory chips 320 may be tilted relative to the major axis 311 of the module substrate 310 by predetermined angles of about 3° to about 40° or about −3° to about −40°. Namely, some first memory chips 320a tilted in the first direction may slant relative to the major axis by angles of about 3° to about 40° or about −3° to about −40°, and some second memory chips 320b may slant along the second direction with respect to the major axis 311 by angles of about 3° to about 40° or about −3° to about −40°. For example, some first memory chips 320a may be tilted relative to the major axis 311 by angles of about 5° to about 30°, and other first memory chips 320a may be tilted with respect to the major axis 311 by angles of about −5° to about −30°. In an example embodiment, some first memory chips 320a may be tilted relative to the major axis 311 by angles of about 5° to about 25°, and other first memory chips 320a may be tilted relative to the major axis 311 by angles of about −5° to about −25°. Similarly, some second memory chips 320b may be tilted relative to the major axis 311 by angles of about 3° to about 40°, and other second memory chips 320b may be tilted with respect to the major axis 311 by angles of about −3° to about −40°. For example, some second memory chips 320b may be tilted relative to the major axis 311 by angles of about 5° to about 30°, and other second memory chips 320b may be tilted with respect to the major axis 311 by angles of about −5° to about −30°. In an example embodiment, some second memory chips 320b may be tilted relative to the major axis 311 by angles of about 5° to about 25°, and other second memory chips 320b may be tilted relative to the major axis 311 by angles of about −5° to about −25°. Again, however, larger or smaller tilt angles may be used in other embodiments.

In example embodiments of the present invention, the semiconductor memory module 350 may correspond to a small outline single inline memory module or a small outline dual inline memory module.

The passive devices 330 may prevent noise from being generated from the memory chips 320. The passive devices 330 may be disposed on the module substrate 310 in a direction substantially parallel to the major axis 311 of the module substrate 310. The passive devices 330 may be located between the adjacent first and second memory chips 320a and 320b. For example, two passive devices 330 may be provided between the first memory chip 320a in the upper area of module substrate 310 and the second memory chips 320b in the lower area of the module substrate 310.

The filling member 135 may be disposed in a space between the module substrate 310 and the memory chips 320. The filling member 135 may be formed in the space between the module substrate 310 and the memory chips 320 by injecting a filling agent into the space between the module substrate 310 and the memory chips 320. Conductive members (not illustrated) may be provided in the space for the electrical connections of the memory chips 320 with respect to the module substrate 310. The conductive members may include solder balls. The filling agent may include a thermosetting resin. The filling agent may be provided from a filling agent supply member into the space between the module substrate 310 and the memory chips 320 to form the filling member 135. To fully fill up the space with the filling member, the filling agent may be injected into the space between the module substrate 310 and the memory chips 320 while moving the filling agent supply member along peripheral portions of the memory chips 320. Since desired intervals among the memory chips 320 may be ensured, the filling member may fully fill up the space between the module substrate 310 and the memory chips 320 without generating a void in the filling member.

Figure 7:
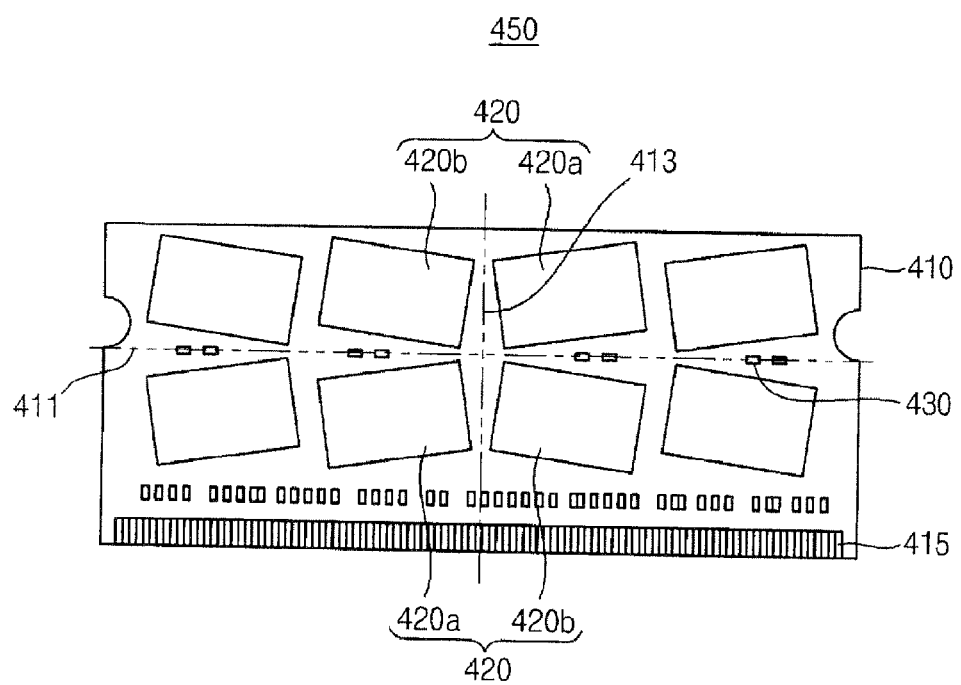
FIG. 7 is a plan view illustrating a semiconductor memory module in accordance with still another embodiment of the present invention.

FIG. 7 is a plan view illustrating a semiconductor memory module in accordance with another embodiment of the present invention.

Referring to FIG. 7, a semiconductor memory module 450 includes a module substrate 410, memory chips 420 mounted on the module substrate 410, passive devices 430, and a filling member (not illustrated).

The module substrate 410 may have a substantially rectangular shape having a major axis 411 and a minor axis 413. A length of the major axis 411 may be substantially longer than that of the minor axis 413.

Some memory chips 420 may be tilted in an upper area of the module substrate 410 along a first direction and a second direction with respect to the major axis 411 of the module substrate 410, whereas other memory chips 420 may slant in a lower area of the module substrate 410 along the first and the second directions relative to the major axis 411 of the module substrate 410. The first direction may be opposite to the second direction.

The module substrate 410 may have mounting regions (not illustrated) where the memory chips 420 are disposed. Wiring or circuits (not illustrated) may be formed on the module substrate 410. The wiring or circuits may electrically connect the memory chips 420 to the module substrate 410 or to each other. In an example embodiment, the module substrate 410 may have first mounting regions and second mounting regions. Additionally, the memory chips 420 may include first memory chips 420a and second memory chips 420b. The first memory chips 420a may be positioned in the first mounting regions and the second memory chips 420b may be disposed in the second mounting regions. The first memory chips 420a may be tilted along the first direction relative to the major axis 411 of the module substrate 410, whereas the second memory chips 420b may be tilted along the second direction.

In some example embodiments of the present invention, the memory chips 420 may include memory chip units including one of the first memory chips 420a and one of the second memory chips 420b. For example, four memory chip units may be provided on the module substrate 410 when eight memory chips 420 are mounted on the module substrate 410. The first and the second memory chips 420a and 420b in the memory unit may be opposed to each other centering on a horizontal axis (here the major axis 411) of the module substrate 410.

In some example embodiments of the present invention, the first and the second memory chips 420a and 420b may be disposed on the module substrate 410 in a matrix structure. For example, the matrix structure may have two rows and four columns. The first and the second memory chips 420a and 420b may be tilted with respect to the row and the column of the matrix structure, respectively. Some memory chip units may be disposed in the upper area of the module substrate 410 and other memory chip units may be positioned in the lower area of the module substrate 410. In each memory chip unit, the first memory chip 420a may be tilted along the first direction, whereas the second memory chip 420b may slant along the second direction. Two memory chip units in the upper area may correspond to an upper row of the matrix structure, and two memory chip units in the lower area may be included in a lower row of the matrix structure when the matrix structure has two rows.

In some example embodiments of the present invention, some memory chips 420 may be horizontally symmetrized relative to other memory chips 420 based on the major axis 411 of the module substrate 410. The module substrate 410 may be divided into upper and lower areas by the major axis 411 of the module substrate 410. For example, each of the first memory chips 420a may be symmetrized relative to the second memory chips 420b centering the major axis 411 of the module substrate 410. The second memory chips 420b in the upper area may be vertically symmetrized with respect to the first memory chips 420a centering on a vertical axis (here the minor axis 413) of the module substrate 410. Additionally, the first and the second memory chips 420a and 420b in the lower area may be vertically symmetrized centering the minor axis 413 of the module substrate 410.

In some example embodiments of the present invention, the first memory chips 420a in the upper area of the module substrate 410 may be symmetrized along the column of the matrix structure with respect to the second memory chips 420b in the upper area of the module substrate 410, respectively. Additionally, the second memory chips 420b in the lower area of the module substrate 410 may be symmetrized along the column of the matrix structure relative to the first memory chips 420a in the lower area of the module substrate 410. Furthermore, the first and the second memory chips 420a and 420b in the upper area of the module substrate 410 may be symmetrized along the row of the matrix structure with respect to the second and the first memory chips 420b and 420a, respectively.

In some example embodiments of the present invention, two of the second memory chips 420b and two of the first memory chips 420a may be sequentially disposed in the upper area of the module substrate 410. Further, two of first memory chips 420a and two of the second memory chips 420b may be sequentially disposed in the lower area of the module substrate 410.

In some example embodiments of the present invention, the memory chips 420 may be tilted relative to the major axis 411 of the module substrate 410 by predetermined angles of about 3° to about 40° or about −3° to about −40°. That is, some first memory chips 420a may be tilted in the first direction relative to the major axis 411 by angles of about 3° to about 40° or about −3° to about −40°, and some second memory chips 420b may be tilted along the second direction with respect to the major axis 411 by angles of about 3° to about 40° or about −3° to about −40°. For example, some first memory chips 420a may slant relative to the major axis 411 by angles of about 5° to about 30°, and other first memory chips 420a may be tilted with respect to the major axis 411 by angles of about −5° to about −30°. In an example embodiment, some first memory chips 420a may be tilted relative to the major axis 411 by angles of about 5° to about 25°, and other first memory chips 420a may be tilted relative to the major axis 411 by angles of about −5° to about −25°. Similarly, some second memory chips 420b may be tilted relative to the major axis 411 by angles of about 3° to about 40°, and other second memory chips 420b may be tilted with respect to the major axis 411 by angles of about −3° to about −40°. For example, some second memory chips 420b may be tilted relative to the major axis 411 by angles of about 5° to about 30°, and other second memory chips 420b may slant with respect to the major axis 411 by angles of about −5° to about −30°. In an example embodiment, some second memory chips 420b may be tilted relative to the major axis 411 by angles of about 5° to about 25°, and other second memory chips 420b may be tilted relative to the major axis 411 by angles of about −5° to about −25°. Again, however, the tilt angles may be larger or smaller in other embodiments.

In example embodiments of the present invention, the semiconductor memory module 450 may correspond to a small outline single inline memory module or a small outline dual inline memory module.

The passive devices 430 may prevent noise from being generated from the memory chips 420. The passive devices 430 may be disposed on the module substrate 410 in a direction substantially parallel to the major axis 411 of the module substrate 410. The passive devices 430 may be located between the adjacent first and second memory chips 420a and 420b. For example, two passive devices 430 may be provided between the first memory chip 420a in the upper area of the module substrate 410 and the second memory chips 420b in the lower area of the module substrate 410.

The filling member 135 may be disposed in a space between the module substrate 410 and the memory chips 420.

The filling member 135 may be formed in the space between the module substrate 410 and the memory chips 420 by injecting a filling agent into the space between the module substrate 410 and the memory chips 420. Conductive members (not illustrated) may be provided in the space for the electrical connections of the memory chips 420 with respect to the module substrate 410. The conductive members may include solder balls. The filling agent may include a thermosetting resin. The filling agent may be provided from a filling agent supply member into the space, thereby forming the filling member. To fully fill up the space with the filling member, the filling agent may be injected into the space between the module substrate 410 and the memory chips 420 while moving the filling agent supply member along peripheral portions of the memory chips 420. Since desired intervals among the memory chips 420 may be ensured, the filling member may fully fill up the space between the module substrate 410 and the memory chips 420 without generating a void in the filling member 135.

Figure 8:
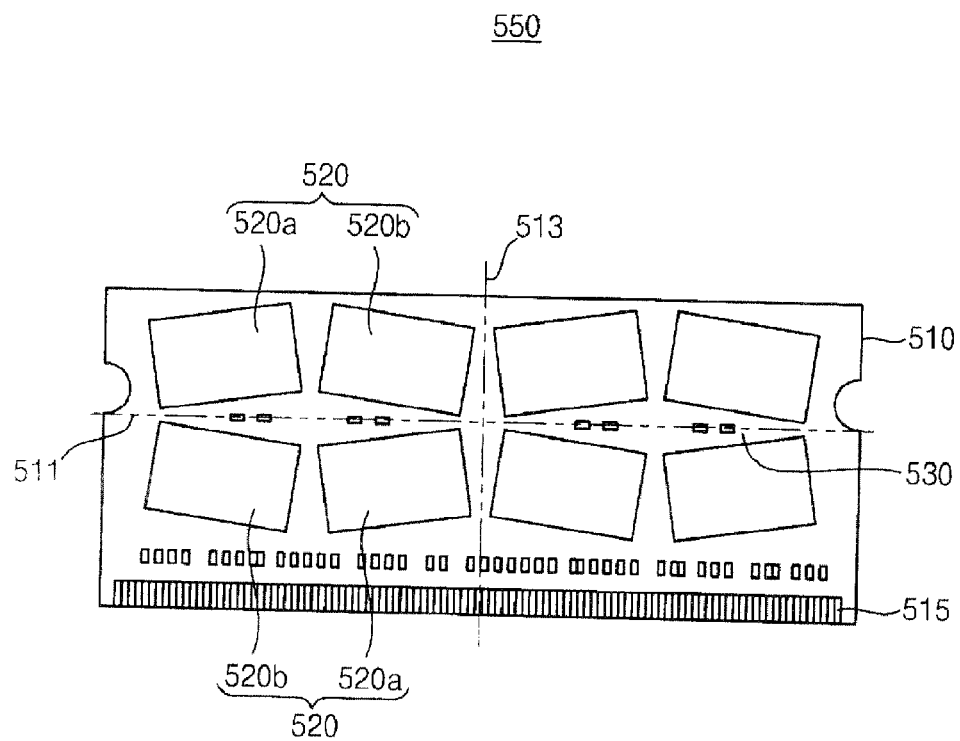
FIG. 8 is a plan view illustrating a semiconductor memory module in accordance with still yet another embodiment of the present invention.

FIG. 8 is a plan view illustrating a semiconductor memory module in accordance with still yet another embodiment of the present invention.

Referring to FIG. 8, a semiconductor memory module 550 includes a module substrate 510, memory chips 520 mounted on the module substrate 510, passive devices 530, and a filling member (not illustrated).

The module substrate 510 may have a substantially rectangular shape that includes a major axis 511 and a minor axis 513. The major axis 511 may have a length substantially longer than that of the minor axis 513.

The memory chips 520 are divided into first memory chips 520a and second memory chips 520b. The first memory chips 520a may be tilted along a first direction relative to the major axis 511 of the module substrate 510, and the second memory chips 520b may be tilted along a second direction with respect to the major axis 511 of the module substrate 510. The first direction may be substantially opposite to the second direction. In some example embodiments, the first and the second memory chips 520a and 520b may be alternately disposed on the module substrate 510 along the major axis 511 and the minor axis 513 of the module substrate 510. Each of the first memory chips 520a may be symmetrized with each of the second memory chips 520b along the major axis 511 and the minor axis 513 of the module substrate 510.

The module substrate 510 may include first mounting regions (now illustrated) on which the memory chips 520 tilted along the first and the second directions are disposed. Wiring or circuits (not illustrated) for electrical connections of the memory chips 520 may be provided on the module substrate 510. In an example embodiment, the first memory chips 520a tilted in the first direction may be disposed in first mounting regions of the module substrate 510, and the second memory chips 520b tilted in the second direction may be positioned in second mounting regions (now illustrated) of the module substrate 510. When the first and the second memory chips 520a and 520b are alternately disposed, the module substrate 510 may also have alternately disposed first and the second mounting regions.

In some example embodiments of the present invention, the memory chips 520 may include the first and the second memory chips 520a and 520b disposed on the module substrate 510 in a matrix structure. The first and the second memory chips 520a and 520b may be tilted with respect to rows or columns of the matrix structure. For example, the matrix structure 510 may have two rows and four columns when eight memory chips 520 are mounted on the module substrate 510.

In some example embodiments of the present invention, the memory chips 520 may include four memory chip units. Each of the memory chip units may include one of the first memory chips 520a tilted along the first direction and one of the second memory chips 520b tilted in the second direction. For example, two memory chip units may be disposed in an upper area of the module substrate 510, whereas two memory chip units may be positioned in a lower area of the module substrate 510. In other words, two memory chip units may correspond to one row of the matrix structure, and two memory chip units may be included in the other row of the matrix structure.

The memory chips 520 may be horizontally symmetrized with one another along a horizontal axis (here the major axis 511) of the module substrate 510. The major axis 511 may define the upper and the lower areas of the module substrate 510. Additionally, the memory chips 520 may be vertically symmetrized with one another along a vertical axis (here the minor axis 513) of the module substrate 510. The minor axis 513 may divide the module substrate 510 into a right area and a left area. Therefore, adjacent two memory chips 520 may have symmetric structures with each other.

In some example embodiments of the present invention, the first and the second memory chips 520a and 520b in the upper area of the module substrate 510 may be alternately disposed along one row of the matrix structure. Further, the second and the first memory chips 520b and 520a in the lower area of the module substrate 510 may be alternately mounted along the other row of the matrix structure. For example, two of the first memory chips 520a and two of the second memory chips 520b may be alternately mounted in the upper area of the module substrate 510. Similarly, another two of the second memory chips 520b and another two of the first memory chips 520a may be alternately disposed in the lower area of the module substrate 510. Thus, the first and the second memory chips 520a and 520b may be alternately mounted on the module substrate 510 along a direction substantially in parallel to the major axis 511 of the module substrate 510. As a result, a space having a diamond shape may be generated among two first memory chips 520a and two second memory chips 520b. That is, a diamond-shaped space may be formed between adjacent two memory chip units.

In some example embodiments of the present invention, the memory chips 520 may be tilted relative to the major axis 511 of the module substrate 510 by predetermined angles of about 3° to about 40° and about −3° to about −40°. Particularly, some first memory chips 520a may slant relative to the major axis 511 by angles of about 3° to about 40°, and other first memory chips 520a may be tilted with respect to the major axis 511 by angles of about −3° to about −40°. For example, some first memory chips 520a may be tilted relative to the major axis 511 by angles of about 5° to about 30°, and other first memory chips 520a may be tilted with respect to the major axis 511 by angles of about −5° to about −30°. In an example embodiment, some first memory chips 520a may be tilted relative to the major axis 511 by angles of about 5° to about 25°, and other first memory chips 520a may be tilted relative to the major axis 511 by angles of about −5° to about −25°. Additionally, some second memory chips 520b may be tilted relative to the major axis 511 by angles of about 3° to about 40°, and other second memory chips 520b may be tilted with respect to the major axis 511 by angles of about −3° to about −40°. For example, some second memory chips 520b may be tilted relative to the major axis 511 by angles of about 5° to about 30°, and other second memory chips 520b may be tilted with respect to the major axis 511 by angles of about −5° to about −30°. In an example embodiment, some second memory chips 520b may be tilted relative to the major axis 511 by angles of about 5° to about 25°, and other second memory chips 520b may be tilted relative to the major axis 511 by angles of about −5° to about −25°.

In an example embodiment of the present invention, the semiconductor memory module 550 may correspond to a small outline single inline memory module. Alternatively, the semiconductor memory module 550 may correspond to a small outline dual inline memory module.

The passive devices 530 may prevent noise from being generated from the memory chips 520. The passive devices 530 may be positioned on the module substrate 510 along the direction substantially in parallel to the major axis 511 of the module substrate 510. The passive devices 530 may be located between the adjacent first and second memory chips 520a and 520b. For example, two passive devices 530 may be provided between the first memory chip 520a in the upper area and the second memory chips 520b in the lower area. Accordingly, four passive devices 530 may be disposed in the diamond-shaped space among the memory chips 520.

The filling member 135 may be disposed in a space between the module substrate 510 and the memory chips 520. The filling member 135 may be formed in the space between the module substrate 510 and the memory chips 520 by injecting a filling agent into the space between the module substrate 510 and the memory chips 520. Conductive members (not illustrated) may be provided in the space for the electrical connections of the memory chips 520 relative to the module substrate 510. Each of the conductive members may include a solder ball. The filling agent may include a thermosetting resin. The filling agent may be provided from a filling agent supply member into the space, thereby forming the filling member. To completely fill up the space with the filling member, the filling agent may be injected into the space between the module substrate 510 and the memory chips 520 while moving the filling agent supply member along peripheral portions of the memory chips 520. Since desired intervals among the memory chips 520 may be ensured, the filling member may fully fill up the space between the module substrate 510 and the memory chips 520 without generating a void in the filling member.

According to example embodiments of the present invention, a semiconductor memory module includes a module substrate and memory chips tilted by predetermined angles so that intervals between adjacent memory chips may be sufficiently enlarged. Therefore, a filling member may completely fill up a space between the module substrate and the memory chips without generating a void in the filling member. As a result, the semiconductor memory module may have improved characteristics by enhancing electrical connections between the module substrate and the memory chips.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor memory module comprising:
   a module substrate having a major axis and a minor axis substantially perpendicular to the major axis; and
   memory chips mounted on the module substrate, each of the memory chips being tilted with respect to the major axis or the minor axis.

2. The memory module of claim 1, wherein each memory chip is tilted by an angle of about 3° to about 40° or about −3° to about −40° with respect to the major axis or the minor axis.

3. The memory module of claim 1, wherein the memory chips are arranged in a matrix structure.

4. The memory module of claim 3, wherein at least some of the memory chips are tilted relative to a column or a row of the matrix structure.

5. The memory module of claim 3, wherein an arrangement of the memory chips is symmetrical relative to a column or a row of the matrix structure.

6. The memory module of claim 1, further comprising a filling member filling up a space between the module substrate and the memory chips.

7. The memory module of claim 1, further comprising at least one passive device disposed between adjacent tilted memory chips.

8. A semiconductor memory module comprising:
   a module substrate of a substantially rectangular shape having a major axis and a minor axis substantially perpendicular to the major axis, wherein the major axis and the minor axis each substantially bisect the module substrate;
   first memory chips mounted on the module substrate, each of the first memory chips being tilted along a first direction relative to the major axis or the minor axis; and
   second memory chips mounted on the module substrate, each of the second memory chips being tilted along a second direction substantially opposed to the first direction.

9. The memory module of claim 8, wherein the first memory chips and the second memory chips are arranged in a matrix structure.

10. The memory module of claim 9, wherein at least some of the first and the second memory chips are tilted relative to a column or a row of the matrix structure.

11. The memory module of claim 9, wherein an arrangement of the first and the second memory chips is symmetrical relative to a column or a row of the matrix structure.

12. The memory module of claim 9, wherein the first and the second memory chips are alternately arranged along the row of the matrix structure.

13. The memory module of claim 8, wherein each of the first and the second memory chips is tilted by an angle of about 3° to about 40° or about −3° to about −40° with respect to the major axis or the minor axis.

14. The memory module of claim 8, further comprising a filling member filling up a space between the module substrate and the first and the second memory chips.

15. The memory module of claim 8, further comprising at least one passive device disposed between adjacent tilted memory chips.

16. A memory module comprising:
    a substantially rectangular module substrate having opposing long side edges and opposing short side edges;

connector pins formed along one of the long side edges of the module substrate, the connector pins structured to facilitate signal communication with a socket of a computer;

a plurality of conductive members mounted on at least an upper face of the module substrate;

a plurality of memory chips mounted on the conductive pads to be electrically connected to the module substrate, wherein at least one of the memory chips is mounted so that side edges of the memory chips are not parallel to the long side edges or short side edges of the module substrate; and a filling member formed between the plurality of memory chips and the module substrate.

17. The memory module of claim 16, wherein each of the plurality of memory chips are mounted so that side edges of each of the memory chips are not parallel to the long side edges or short side edges of the module substrate.

18. The memory module of claim 17, wherein each memory chip is substantially rectangular in shape and is mounted so that a first corner of a long side edge of the memory chip is closer to an adjacent memory chip that a second corner of the long side edge of the memory chip.

19. The memory module of claim 18, wherein the long side edge of the memory chip is tilted from a line running parallel to the long side edge of the module substrate by about 5° to about 25° or about −5° to about −25°

20. The memory module of claim 16, wherein the memory chips are mounted in a matrix format having at least two rows and two columns.

21. The memory module of claim 20, wherein the memory chips in the same row are symmetrically aligned with each other.

22. The memory module of claim 20, wherein at least one memory chip in a row is inversely aligned with at least one other memory chip in the same row.

23. The memory module of claim 20, wherein at least one memory chip in a column is inversely aligned with at least one other memory chip in the same column.

* * * * *